(12) United States Patent
Benthem

(10) Patent No.: US 10,101,099 B2
(45) Date of Patent: Oct. 16, 2018

(54) RADIATOR, AS WELL AS SPACE VEHICLE STRUCTURE COMPRISING SUCH RADIATOR

(71) Applicant: Airbus Defence and Space Netherlands B.V., Leiden (NL)

(72) Inventor: Bruin Benthem, Leiden (NL)

(73) Assignee: Airbus Defence and Space Netherlands B.V., Leiden (NL)

( * ) Notice: Subject to any disclaimer, the term of this patent is extended or adjusted under 35 U.S.C. 154(b) by 49 days.

(21) Appl. No.: 14/645,694

(22) Filed: Mar. 12, 2015

(65) Prior Publication Data
US 2016/0265857 A1 Sep. 15, 2016

(51) Int. Cl.
| | | |
|---|---|---|
| *F28F 13/18* | (2006.01) |
| *B64G 1/50* | (2006.01) |
| *B64G 1/58* | (2006.01) |
| *F28F 21/02* | (2006.01) |
| *F28D 15/02* | (2006.01) |
| *H01L 23/427* | (2006.01) |
| *F28D 21/00* | (2006.01) |

(52) U.S. Cl.
CPC .............. *F28F 13/18* (2013.01); *B64G 1/503* (2013.01); *B64G 1/58* (2013.01); *F28D 15/0275* (2013.01); *F28F 21/02* (2013.01); *F28D 2021/0021* (2013.01); *F28F 2270/00* (2013.01); *H01L 23/427* (2013.01)

(58) Field of Classification Search
CPC .. B64G 1/58; B64G 1/503; F28F 13/18; F28F 21/02; F28F 2270/00; F28D 15/0275; F28D 2021/0021; H01L 23/427
See application file for complete search history.

(56) References Cited

U.S. PATENT DOCUMENTS

| | | | | |
|---|---|---|---|---|
| 5,117,901 A | * | 6/1992 | Cullimore | ................ B64G 1/50 165/104.26 |
| 5,806,800 A | * | 9/1998 | Caplin | ................... B64G 1/503 165/41 |
| 6,075,701 A | * | 6/2000 | Ali | ...................... H01L 23/3732 174/252 |

(Continued)

FOREIGN PATENT DOCUMENTS

| | | | |
|---|---|---|---|
| EP | 0 822 139 A1 | 2/1998 | |
| FR | 2 797 556 A1 | 2/2001 | |
| WO | WO 03064258 A1 | * 8/2003 | ............. B64G 1/503 |

OTHER PUBLICATIONS

Mark J. Montesano, Spacecraft Thermal Management Solutions Using Annealed Pyrolytic Graphite, Apr. 7, 2008, AIAA.*

(Continued)

*Primary Examiner* — Valentina Xavier
(74) *Attorney, Agent, or Firm* — Lindsey A. Auerbach; Cathering A. Shultz; N.V. Nederlandsch Octrooibureau

(57) ABSTRACT

A radiator, comprising at least one heat conductive layer with pyrolytic graphite material and an in-plane heat conductivity of at least 500 W/m·K. The radiator further comprises at least one heat emission layer that is in contact with the heat conductive layer, wherein the emission layer has an exposed surface with an emissivity of at least 0.7. The radiator is to be used in combination with a space vehicle structure, and due to its flexible character may be conformed to the particular shapes of such structure.

17 Claims, 3 Drawing Sheets

(56) References Cited

U.S. PATENT DOCUMENTS

| | | | |
|---|---|---|---|
| 6,215,661 B1 | 4/2001 | Messenger et al. | |
| 6,378,809 B1* | 4/2002 | Pon | B64G 1/503 244/171.8 |
| 6,776,220 B1* | 8/2004 | Low | B64G 1/506 165/104.33 |
| 6,994,155 B2* | 2/2006 | Dessiatoun | F28D 7/00 165/165 |
| 7,028,953 B2* | 4/2006 | Sebata | B64G 1/503 244/171.8 |
| 7,416,019 B2* | 8/2008 | Osiander | B82Y 30/00 165/96 |
| 7,967,256 B2* | 6/2011 | Wong | B64G 1/425 244/171.8 |
| 2003/0089484 A1* | 5/2003 | Biter | B64G 1/503 165/41 |
| 2006/0228897 A1* | 10/2006 | Timans | H01L 21/67115 438/758 |
| 2008/0289801 A1* | 11/2008 | Batty | B64G 1/503 165/104.14 |
| 2009/0087640 A1* | 4/2009 | Li | H05K 7/20981 428/304.4 |
| 2009/0166021 A1 | 7/2009 | Slaton et al. | |
| 2011/0277959 A1* | 11/2011 | Morin | B64G 1/503 165/104.11 |

OTHER PUBLICATIONS

Leach, Cox, "Flexible deployable-retractable space radiators", Jun. 1, 1977, American Institute of Aeronautics and Astronautics, Abstract.*

* cited by examiner ns satellites whereby the radiator may achieve very high temperatures when exposed to the sunlight.

RADIATOR, AS WELL AS SPACE VEHICLE STRUCTURE COMPRISING SUCH RADIATOR

FIELD OF THE INVENTIONS

The invention is related to radiators which are used in spacecraft to reject heat. Typical examples of heat dissipating components are for instance electronics and traveling wave tube amplifiers (TWTA's) used in telecommunications satellites. Characteristic parameters for the performance of such a radiator are the emissivity of the radiator surface and the (fin-)efficiency. The emissivity is determined by the coating applied to the radiator's surface and is generally 0.7 [-] or higher. Common choices for such coatings are Optical Solar Reflectors (OSRs), Second Surface Mirror (SSM) foils and white- or black paint.

BACKGROUND OF THE INVENTIONS

The efficiency is measure of the effectiveness of the radiator in achieving a uniform temperature across its surface. A typical efficiency is >80%. The efficiency depends among other factors on the in-plane heat conductivity of the radiator. An acceptable efficiency may be realized through the use of (linear) heat transporting devices such as heat pipes, loop heat pipes, or mechanically pumped fluid loops. These devices are embedded in or attached to a panel manufactured from a material with a high ratio of heat conductivity to weight, such as aluminium.

For typical telecommunications satellites, a radiator generally consists of an (aluminium) sandwich panel with an (aluminium) honeycomb core with embedded constant conductance heat pipes spaced at regular intervals. Besides acting as radiator, such a panel also has a structural function in the sense that it forms (part of) the spacecraft load carrying structure. The panels are found typically on the North- and South walls of telecommunications spacecraft, and are usually carried out as sandwich panels with a honeycomb core equipped with embedded heat pipes for transport of heat.

The advantage of these devices is that the thermal function can be fulfilled at a minimal cost of mass and without adding any additional parts to the spacecraft. However such devices are required to fulfill a specific structural function, placing requirements on the device that may be incompatible with the thermal requirements or simply inconvenient in some circumstances. For instance, these structures by definition are required to be stiff whereas it may be desirable to provide a flexible radiator for certain reasons.

Further radiators are known which typically consist of a rigid panel manufactured from highly conductive material such as aluminium, high-conductive carbon fiber and in some cases copper. In some cases the panel is a composite structure with a honeycomb core for mass efficiency. These devices are mounted to a supporting structure with standoffs which are often made from a low thermally conductive material. They are insulated from the supporting structure by a multilayer insulation blanket.

The advantage of such a device is that it can be optimized for its thermal function without fulfilling a mechanical function and as such they are employed in cases where radiator temperatures are incompatible with the temperature requirements of the supporting structure. This is typically the case in devices providing cooling to infrared instrument systems and in East-West radiator systems on telecommu- As spacecraft payloads increase also the heat generated by the payload increases, creating demand for ever larger radiators. In this connection, deployable radiators have been developed. These deployable radiators consist of one or more rigid panels interconnected by hinges and fitted with a flexible heat transportation device such as a loop heat pipe or mechanically pumped fluid loop. The advantage of such a device is that a large radiating surface can be launched into orbit while being stored during launch in a very limited volume. The rigidity of the panels themselves however imposes limitations on the use thereof.

Thus, in a number of cases it is not possible or desirable to combine a structural function with the thermal function of a radiator panel. As mentioned before, this is for instance the case when the required radiator temperature is incompatible with the structure temperature. As an example, reference is made to radiators which provide thermal control to payloads with a temperature significantly higher or lower than room temperature.

Furthermore, the use of a thermal switch (e.g. a variable conductance heat pipe or loop heat pipe with bypass valve) may cause temperatures experienced by the radiator to be incompatible with the structure's temperature limits. As an example, reference is made to a radiator providing thermal management to a room temperature unit. Such radiator may nevertheless experience very high temperatures when the thermal switch is open and the radiator is exposed to direct sunlight.

Also, it may occur that the structural function places requirements on the panel which are incompatible with the thermal function. For instance, the position of attachment provisions or inserts may interfere with heat pipe layout. Problems may also rise in case strength and/or stiffness requirements imply the choice of an unsuitable material such as titanium, steel.

Apart from these circumstances, it may be beneficial to separate the structural and thermal functions into two different systems for reasons of mass, cost or manufacturability, etc. Typically in such cases a dedicated radiator panel is mounted on the structure and thermally decoupled by the use of standoffs and multilayered insulation (MLI).

SUMMARY OF THE INVENTIONS

The object of the invention is to provide an improved radiator which satisfies one or more of the above requirements. Said object is achieved by means of a radiator comprising at least one heat conductive layer having an in-plane heat conductivity of at least 500 W/mK and at least one heat emission layer in contact with the heat conductive layer, wherein the emission layer has an exposed surface with an emissivity of at least 0.7.

The heat conductive layer provides a desirable, increased heat transport capacity, aimed at distributing the heat over the full surface thereof. The adjacent heat emission layer which is in contact with the heat conductive layer, is then able to reject the heat by radiation. With the aim of providing a relatively high in-plane heat conductivity of at least 500 W/mK, the heat conductive layer preferably comprises pyrolytic graphite material.

The required high emissivity of the exposed surface of the heat emission layer may be obtained in several ways, e.g. by applying a coating of kapton, and/or white paint, and/or black paint. These coatings include aluminized kapton film as Second Surface Mirror (SSM), silvered fluorinated ethylene propylene (FEP), kapton black film or opaque black kapton, normal kapton or clear kapton, white paint applied on film (e.g. kapton film, titanium film, FEP film etc.), black paint applied on film (e.g. kapton film, titanium film, FEP film etc.). Kapton is a polyimide film material; its chemical name is poly(4,4'-oxydiphenylene-pyromellitimide)

With the aim of transporting heat to the radiator, a heat supply device, such as a heat pipe, a thermal strap or cold finger, may be provided. This heat supply device is in contact with at least one of the layers, preferably with the heat conductive layer. In this connection, the layers may be at least partly conformed to the cross sectional circumference of the heat supply device. The at least one heat conductive layer and the at least one heat emission layer may be adhered to each other through an adhesive material, forming a laminate. Preferably, the laminate has a flexible character, in such a way that the shape of the radiator may be adapted to local requirements. For instance, such flexible laminate may be bent or folded or arranged onto the irregular shapes of a satellite housing etc.

The contact between the heat supply device and the several layers of the radiator may be obtained in different manners. According to a first possibility, the heat supply device may be clamped onto the heat conductive layer. Such clamping cooperation may for instance be obtained through a counter piece in such a way that the heat conductive layer and preferably the heat emission layer are clamped between the heat supply device and the counter piece. Preferably, mechanical connection means, such as bolts, may extend through these layers, the heat supply device and the counter piece.

Alternatively or additionally, the heat supply device may be laminated onto the heat conductive layer, e.g. by means of an adhesive. Preferably, a reinforcement element is positioned on, and preferably adhered to, the heat supply device opposite the side thereof which is laminated onto the heat conductive layer. For the purpose of protecting the laminate thus obtained against delamination, preferably mechanical connection means, such as stitches, may extend through the layers and the reinforcement element. The radiation capacity may be enhanced in case the exposed surface of the reinforcement element is provided with a coating having an emissivity of at least 0.7.

The radiator may for instance be applied onto a space vehicle supporting structure. In a further development of the radiator, at least one insulation layer may be provided opposite with respect to, and facing away from, the exposed surface of the emission layer. In case the desired or expected radiator temperatures are incompatible with the temperatures of the supporting structure or surrounding environment the insulation integrated to the back of the radiator provides the required protection of said structure. The insulation may be of any suitable type, e.g. conventional aluminized mylar-/kapton thermal blankets, polyimide foam multilayer insulation (MLI), integrated multilayer insulation (IMLI), etc.

In certain cases, an insulation layer may comprise a cutout at the location of which a heat supply device is accommodated. Alternatively, the insulation layer may be conformed to the shape of the heat supply device. Preferably, the heat conductive layer, the heat emission layer and the insulation layer(s) are connected to each other through stitching, grommets, standoffs, tape or spot welds, thus forming a mechanically interconnected unit.

EPA822139 discloses a flexible radiator which comprises a conductive aluminium foil and a radiation foil. These foils are adhered to each other through an adhesive layer. The radiator may be rolled up before launch, and may thereafter be deployed by unrolling. The aluminium foil does not have a thermal conductivity of at least 500 W/mK.

FRA2797556 discloses a heat dissipater which is located between a heat source, such as a housing containing electronic equipment, and a radiator. The heat dissipater has a heat conductive layer of pyrolytic graphite material which is encapsulated in an aluminium cover. The heat dissipater merely acts as a means for transferring heat from the housing to the radiator. The aluminium cover does not have an emissivity of at least 0.7.

US-A-2009/0166021 discloses a heat sink consisting of a pyrolytic graphite element adhered to an aluminium or copper plate which is provided with multiple ribs. Said prior art heat sink is applied for cooling electronic equipment and relies on the principle of convection. It is therefore not a radiator in the context of the present invention, i.e. a heat rejection device that relies on the principle of radiation.

The invention is furthermore related to a structure, such as a space vehicle structure, comprising a structural component as well as a radiator as described before, having at least one heat conductive layer of thermally conductive material having an in-plane heat conductivity of at least 500 W/mK and at least one heat emission layer in contact with the heat conductive layer, wherein the emission layer has an exposed surface with an emissivity of at least 0.7 and wherein the heat conductive layer comprises pyrolytic graphite material, wherein the radiator is connected to the structural component such as through an adhesive, or through hook and loop connectors (Velcro®).

The thickness of the heat conductive layer may be between 25 µm-100 µm, preferably between 50-100 µm; the thickness of the heat emission layer is preferably between 25-150 µm. The radiator thus obtained has a flexible character and may therefore be conformed to the shape of the object onto which said radiator is applied.

At least one insulation layer may be provided opposite with respect to, and facing away from, the exposed surface of the emission layer and wherein the at least one insulation layer faces the structural element and the heat emission layer faces away from the structural element.

BRIEF DESCRIPTION OF THE DRAWINGS

The invention will now be described further with reference to the drawings.

DETAILED DESCRIPTION OF THE INVENTIONS

Figure 1:
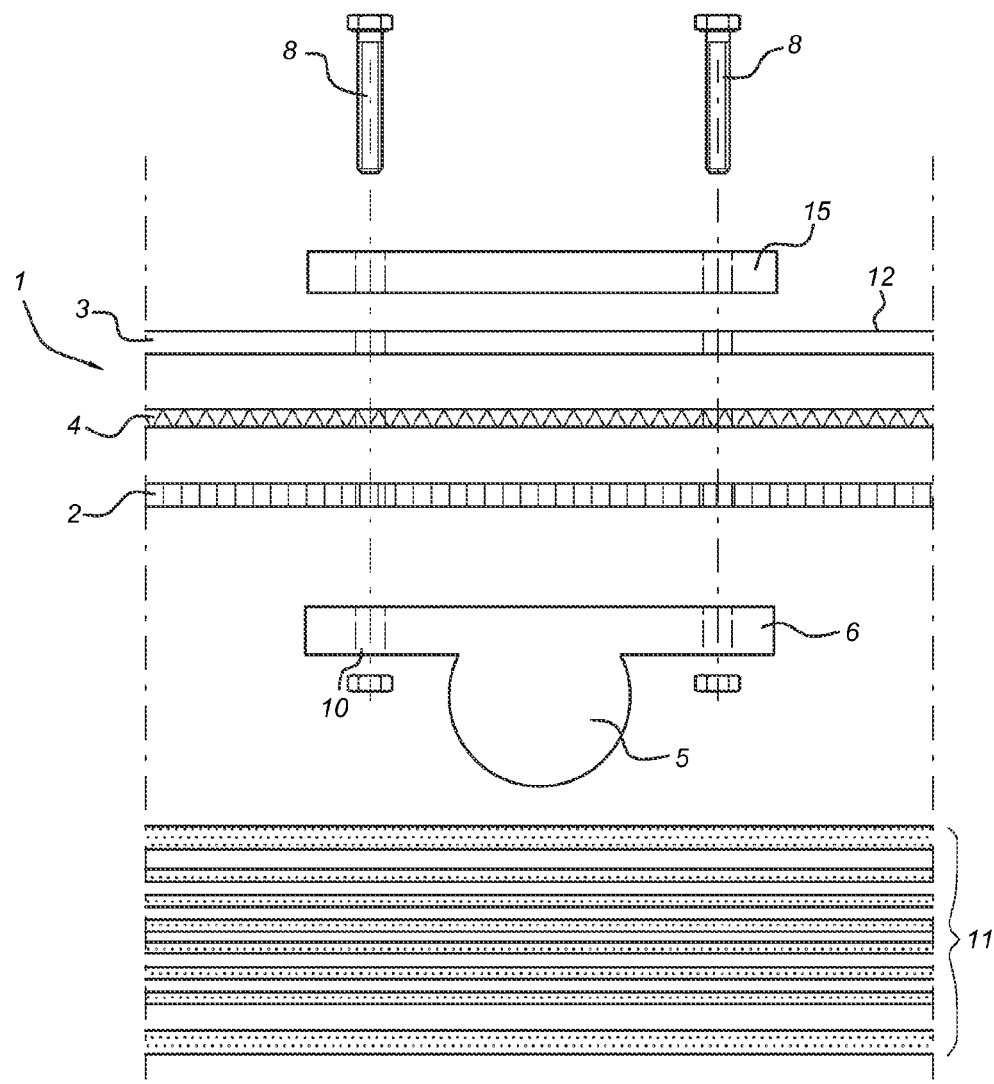
FIG. 1 shows an exploded view of a first embodiment of the radiator.

The exploded view of FIG. 1 shows the several layers of a radiator 1, i.e. the heat conductive layer 2, the heat emission layer 3, and the adhesive layer 4. By means of the adhesive layer 5, the heat conductive layer 2 and the heat emission layer 4 are held in intimate contact so as to ascertain the transfer of heat. The heat is supplied to the heat conductive layer 2 by means of the heat supply device 5 which has integral flanges 6. The flanges 6 are provide with screw threaded bores in which the bolts 8 are screwed. These bolts extend through corresponding holes in the several layers, and are supported by the counter piece 15 which is located opposite the heat supply device. Thus, the heat supply device 5 is firmly clamped onto the heat conductive layer 2, as a result of which the heat can be readily distributed over the heat conductive layer 2, and emitted at the exposed surface 12 of the heat emission layer 3.

The radiator may also comprise a heat insulation 11, which as shown may consist of several layers. This heat insulation is located at the side of the heat conductive layer, and serves to protect the underlying structure onto which the radiator is mounted.

Figure 2:
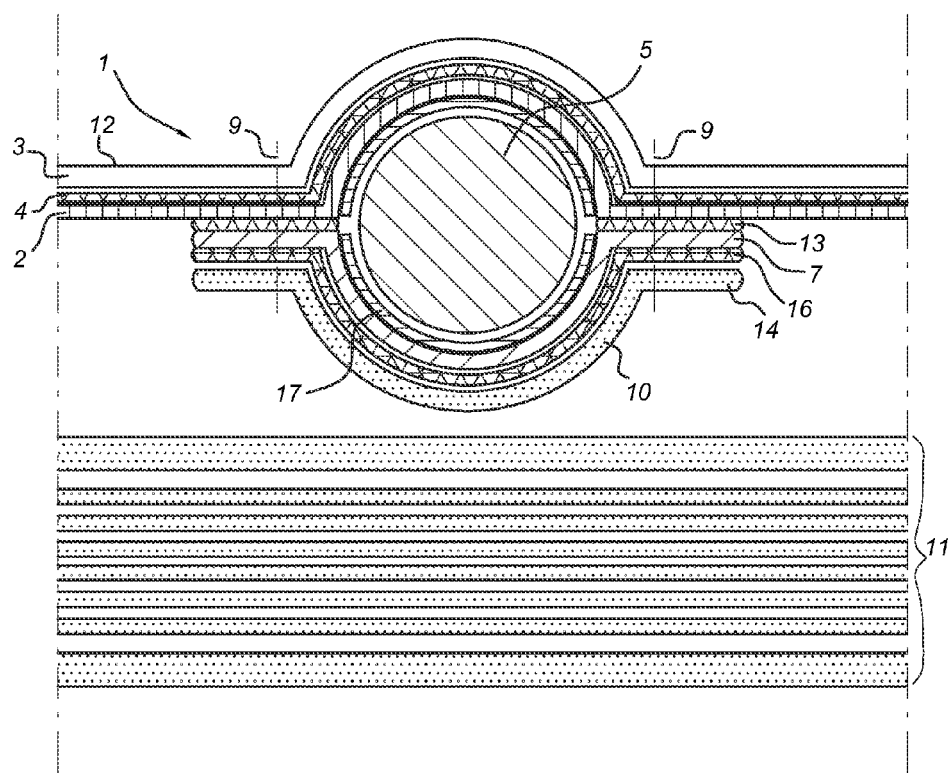
FIG. 2 shows a second embodiment of the radiator.

FIG. 2 shows an embodiment of the radiator 1 having a heat conductive layer 2, a heat emission layer 3 and an interposed adhesive layer 4 as well. However, the heat transfer contact between the heat conductive layer 2 and the heat supply device 5 is now solely obtained through the adhesive material 13 which is located between these components. The layers in question are all conformed to the outer shape of the heat supply device 5, so as to obtain a laminate which favors the heat transfer from the heat supply device 5 to the heat emission layer 3. The heat supply device 5 is located opposite the exposed surface 12 of the heat emission layer 3.

With the aim of further enhancing the bond between the several layers, stitches 9 have been applied there through. In this connection, a reinforcement sheet 14 has been applied at the side of the heat supply device 5 which is turned away from the exposed surface of the heat emission layer 3. This reinforcement sheet 14 is adhered to a heat conductive sheet 7 through the adhesive material 16, which heat conductive sheet 7 in turn is adhered to the heat supply device 5 through the adhesive material 17. The heat emission is further improved by providing a heat emission coating 10 on the outside of the reinforcement sheet 14. An insulation layer 11 is applied at the side facing away from the exposed surface 12 of the heat emission layer 3.

Figure 3:
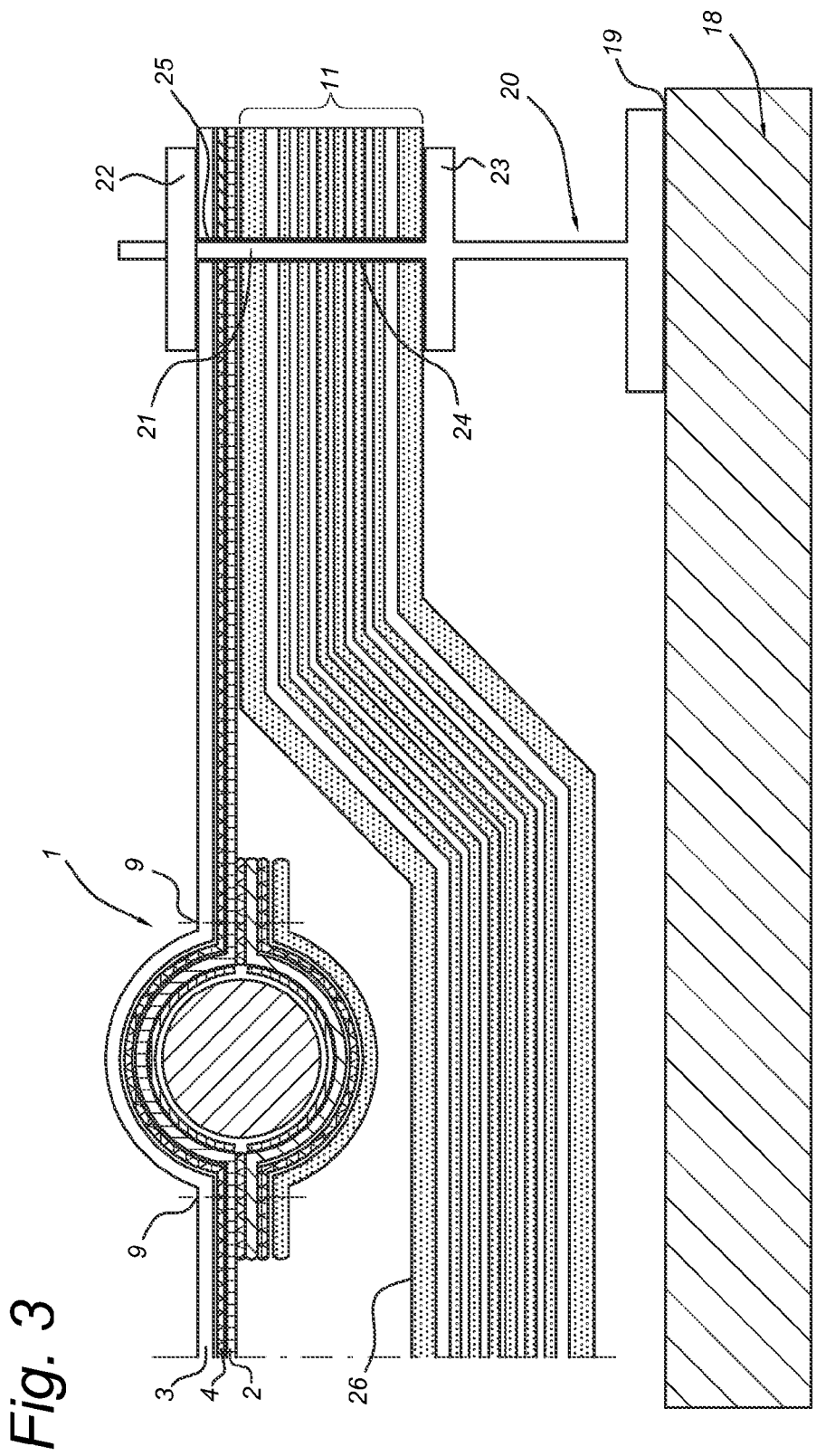
FIG. 3 shows the radiator of FIG. 2 as mounted to a spacecraft structure.

In FIG. 3, a spacecraft structure has been indicated by reference numeral 18. Said spacecraft structure carries a mounting post 20 through an adhesive layer 19. The mounting post 20 has a shaft 21 which is fitted in corresponding holes 24, 25 of respectively the insulation layer 11 and the radiator 1. These components are clamped between the fixed disc 23 which is fixed on the shaft 21 and the moveable disc 22 which is pressed onto the radiator 1. At the location of the heat supply device 5, the insulation layer 11 is provided with a recessed part 26. The package consisting of the insulation layer 1 and the radiator 1 is fixed onto the spacecraft structure by a multitude of such mounting posts 20.

LIST OF REFERENCE NUMERALS

1. Radiator
2. Heat conductive layer
3. Adhesive layer
4. Heat emission layer
5. Heat supply device
6. Flange of heat supply device
7. Heat conductive sheet
8. Bolt
9. Stitch
10. Heat emission coating
11. Insulation
12. Exposed surface of heat emission layer
13. Adhesive layer
14. Reinforcement sheet
15. Counter piece
16. Adhesive material
17. Adhesive material
18. Spacecraft structure
19. Adhesive layer
20. Mounting post
21. Shaft
22. Moveable disc
23. Fixed disc
24. Hole in insulation layer
25. Hole in radiator
26. Recessed part of insulation layer

The invention claimed is:

1. A radiator, comprising:
   at least one heat conductive layer comprising pyrolytic graphite material and having an in-plane heat conductivity of at least 500 W/mK, and
   at least one heat emission layer in contact with the heat conductive layer, wherein the emission layer has an exposed surface with an emissivity of at least 0.7;
   wherein the at least one heat conductive layer and the at least one heat emission layer are adhered to each other through an adhesive material, and form a flexible laminate.

2. The radiator according to claim 1, comprising at least one heat supply device, which is in contact with at least one of the layers.

3. The radiator according to claim 2, wherein the heat supply device is laminated onto the heat conductive layer.

4. The radiator according to claim 3, wherein a reinforcement element is positioned on the heat supply device opposite the side thereof which is laminated onto the heat conductive layer.

5. The radiator according to claim 1, wherein the thickness of the heat conductive layer is between 25-100 µm, and the thickness of the heat emission layer is between 25-150 µm.

6. The radiator according to claim 1, wherein at least one insulation layer is provided opposite with respect to, and facing away from, the exposed surface of the emission layer.

7. The radiator according to claim 6, wherein the at least one insulation layer comprises a cutout at the location of which a heat supply device is accommodated, or wherein the at least one insulation layer is conformed by means of a recessed part to the heat supply device.

8. The radiator according to claim 6, wherein the heat conductive layer, the heat emission layer and the at least one insulation layer are connected to each other, through stitching, grommets, standoffs, tape, or spot welds.

9. The radiator according to claim 1, wherein the exposed surface of the heat emission layer comprises kapton, and/or white paint, and/or black paint, and/or aluminized kapton film as Second Surface Mirror, and/or silvered fluorinated ethylene propylene, and/or kapton black film, and/or normal kapton, and/or white paint applied on film, and/or black paint applied on film.

10. A space vehicle structure, comprising a structural component as well as a radiator according to claim 1, having at least one heat conductive layer of thermally conductive material comprising pyrolytic graphite material and having an in-plane heat conductivity of at least 500 W/mK, and at least one heat emission layer in contact with the heat conductive layer, wherein the emission layer has an exposed surface with an emissivity of at least 0.7 wherein the radiator is connected to the structural component.

11. The space vehicle structure according to claim 10, wherein at least one insulation layer is provided opposite with respect to, and facing away from, the exposed surface of the emission layer and wherein the at least one insulation layer faces the structural element and the heat emission layer faces away from the structural element.

12. The space vehicle structure according to claim 11, wherein mounting posts are connected to the structural component and the insulation layer and the radiator are supported by means of the mounting posts.

13. The radiator according to claim 7, wherein the heat conductive layer, the heat emission layer and the insulation layer(s) are connected to each other, through stitching, grommets, standoffs, tape, or spot welds.

14. The space vehicle structure according to claim 10, wherein at least one insulation layer is provided opposite with respect to, and facing away from, the exposed surface of the emission layer and wherein the at least one insulation layer faces the structural element and the heat emission layer faces away from the structural element.

15. The radiator according to claim 2, wherein the at least one heat supply device is a heat pipe, a thermal strap, or a cold finger.

16. The radiator according to claim 2, wherein the at least one heat supply device is clamped onto the heat conductive layer, and wherein a counter piece is provided such that the heat conductive layer and the heat emission layer are clamped between the at least one heat supply device and the counter piece.

17. The radiator according to claim 1, wherein the at least one heat conductive layer and the at least one heat emission layer are adhered to each other to form a flexible laminate such that the shape of the radiator is adaptable to be locally bent, folded, or arranged onto irregular shapes of a space vehicle structure.

* * * * *